(12) United States Patent
Daden et al.

(10) Patent No.: US 6,560,121 B1
(45) Date of Patent: May 6, 2003

(54) METHOD FOR SURFACE MOUNTING OF A MICROWAVE PACKAGE ON A PRINTED CIRCUIT AND PACKAGE AND PRINTED CIRCUIT FOR IMPLEMENTING SAID METHOD

(75) Inventors: Jean-Yves Daden, Bois Colombes (FR); Muriel Gohn-Devineau, Chatou (FR); Gérard Cachier, Bures sur Yvette (FR); Pascal Etourneau, Cholet (FR); Vincent Jahier, St Leu la Foret (FR); Alain Grancher, Vemars (FR); Ludovic Michel, Plaisir (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/554,595
(22) PCT Filed: Nov. 24, 1998
(86) PCT No.: PCT/FR98/02515
  § 371 (c)(1),
  (2), (4) Date: May 26, 2000
(87) PCT Pub. No.: WO99/29148
  PCT Pub. Date: Jun. 10, 1999

(30) Foreign Application Priority Data
Nov. 28, 1997 (FR) .............................. 97 15008
Aug. 4, 1998 (FR) .............................. 98 10016

(51) Int. Cl.$^7$ ................................................ H05K 7/02
(52) U.S. Cl. ...................................................... 361/760
(58) Field of Search ................................ 361/760–767, 361/770, 771, 777, 783, 790, 793; 174/138 C, 266, 267

(56) References Cited

U.S. PATENT DOCUMENTS

| | | | | |
|---|---|---|---|---|
| 4,543,544 A | * | 9/1985 | Zeigner | 333/34 |
| 4,626,805 A | * | 12/1986 | Jones | 333/33 |
| 4,701,723 A | * | 10/1987 | Kameya | 333/33 |
| 4,914,551 A | * | 4/1990 | Anschel et al. | 361/389 |
| 4,942,076 A | * | 7/1990 | Panicker et al. | 428/137 |
| 4,962,416 A | * | 10/1990 | Jones et al. | 357/81 |
| 5,089,881 A | * | 2/1992 | Panicker et al. | 357/80 |
| 5,173,844 A | * | 12/1992 | Adachi et al. | 361/414 |
| 5,206,986 A | * | 5/1993 | Arai et al. | 174/266 |
| 5,294,897 A | * | 3/1994 | Notani et al. | 333/33 |
| 5,418,329 A | * | 5/1995 | Katoh et al. | 174/52.3 |

FOREIGN PATENT DOCUMENTS

| | | | |
|---|---|---|---|
| EP | 0718905 A1 | * | 6/1996 |
| GB | 2286084 | * | 8/1995 |
| WO | WO 96/27282 | * | 9/1996 |

* cited by examiner

Primary Examiner—David Martin
Assistant Examiner—Thanh S. Phan
(74) Attorney, Agent, or Firm—Oblon, Spivak, McClelland, Maier & Neustadt, P.C.

(57) ABSTRACT

The surface mounting of a backset microwave package on a printed circuit. After the package has been accurately positioned against the printed circuit the connections are produced by soldering the conducting elements in direct contact. A chip is enclosed in a sort of cage constituting a screen which replaces a conventional cover, the cage is formed by layouts borne respectively by the package and the printed circuit and is linked together by metal links. The surface mounting is particularly applicable to packages operating in millimetric microwaves.

8 Claims, 5 Drawing Sheets

METHOD FOR SURFACE MOUNTING OF A MICROWAVE PACKAGE ON A PRINTED CIRCUIT AND PACKAGE AND PRINTED CIRCUIT FOR IMPLEMENTING SAID METHOD

BACKGROUND OF THE INVENTION

1. Field of the Invention

The present invention relates to a process for surface-mounting a microwave package, which includes an electronic chip, on a printed circuit and to a package and a printed circuit which are designed for implementing this process.

2. Discussion of the Background

It is known practice to mount an electronic chip directly on a receiving printed circuit; it is also known practice to mount the chip on a miniature printed circuit in order to form a microwave package which is then surface-mounted on the receiving printed circuit. In both cases, it is known practice to make the connections to the receiving printed circuit by wire connections and to cover the microwave chip or package with a protective lid. However, the use of such mounting techniques in high volume is expensive since, for high operating frequencies, it requires, for making the wire connections, when furnishing the receiving printed circuit, the use of microelectronic equipment; without such equipment, it is virtually impossible, using these mounting techniques, to work at frequencies above 12 GHz.

SUMMARY OF THE INVENTION

The object of the present invention is to avoid this drawback.

This is achieved by mounting a miniature printed circuit bearing the chip on a receiving printed circuit, in which the active face of the miniature printed circuit bearing the chip is soldered to the receiving printed circuit and in which earth planes distributed over the two printed circuits form a kind of cage constituting a screen around the chip.

According to the invention, what is proposed is a process for the mounting of a microwave package on a printed circuit, characterized in that it consists in using, for the package, a microwave package having two parallel faces, a first face of which has an electronic chip, conductors connected to the chip and earth planes inserted between the conductors, and a second face of which consists of an earth plane connected to the earth planes of the first face, in producing the printed circuit in such a way that it has a first face with, in a region dedicated to the package, conductors and earth planes and a second face consisting of an earth plane connected to the earth planes of the first face of the printed circuit, the first two faces having, on the one hand, their earth planes and, on the other hand, their conductors which, in a predetermined position of the package on the printed circuit, are in one-to-one contact, in placing the package in the predetermined position and in connecting the package to the printed circuit by soldering the conductors and the earth planes in one-to-one contact.

According to the invention, what is proposed is a microwave package for the implementation of a process for mounting a package on a printed circuit, this microwave package including a miniature printed circuit with first and second faces, the first face having an electronic chip and conductors connected to the chip, and the second face consisting of an earth plane, characterized in that the first face includes earth planes, in that these earth planes are inserted between the conductors and in that the miniature printed circuit includes connections between the earth planes of the first face and the earth plane of the second face.

According to the invention, what is proposed is a printed circuit for receiving a microwave package, for the implementation of a process for mounting a package on a printed circuit, this receiving printed circuit including first and second faces, the first face including, in a receiving region, conductors and the second face consisting of an earth plane, characterized in that the first face includes earth planes in the receiving region, in that these earth planes are inserted between the conductors and in that the receiving printed circuit includes connections between the earth planes of the first face and the earth plane of the second face.

BRIEF DESCRIPTION OF THE DRAWINGS

The present invention will be more clearly understood and further features will appear from the description below and from the figures relating thereto, which illustrate.

DESCRIPTION OF THE PREFERRED EMBODIMENTS

In the various figures, the corresponding elements are denoted by the same reference symbols.

In the following and in the claims, when reference is made to a printed circuit one of whose two sides is entirely metallized, and this side will be soldered to a metal support, it will be assumed that the metal support forms part of the printed circuit and constitutes the earth plane thereof.

Figure 1:
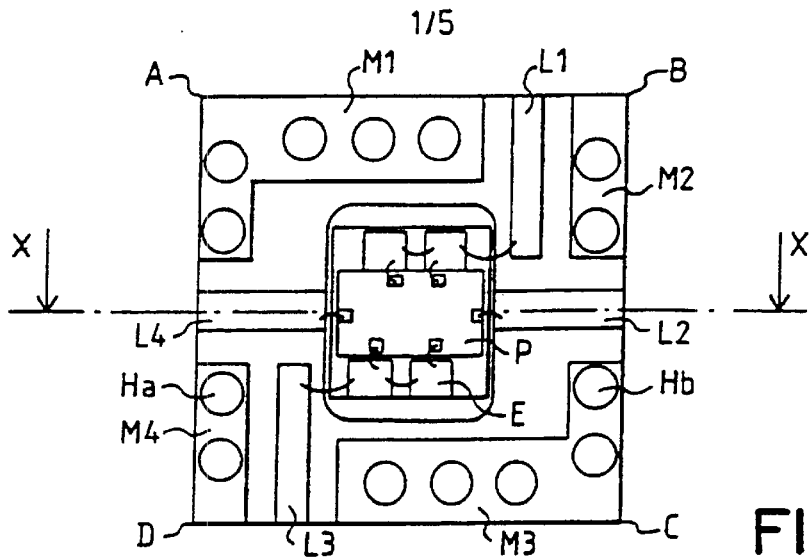
in FIGS. 1 and 2, the views of one of the faces of two printed circuits; this is the face which bears, among other elements, conductors, and the view in FIG. 2 is a partial view.

FIG. 1 shows a microwave package for an electronic chip P; it consists of a miniature printed circuit, of which FIG. 1 shows a square face ABCD with conducting tracks L1 to L4, earth planes M1 to M4, which are inserted between the tracks, and the chip P linked to four decoupling elements such as E. The chip P lies approximately in the middle of the face ABCD; wires bonded at their ends provide the connections between the various elements in this package.

Tracks L2, L4 are connected respectively to two microwave contacts on the chip, while the tracks L1, L3 supply the chip with bias voltages. Each of the earth planes M1 to M4 is drilled with holes, such as Ha, Hb; in total, there are fourteen holes distributed near the periphery of the square ABCD.

Figure 3:
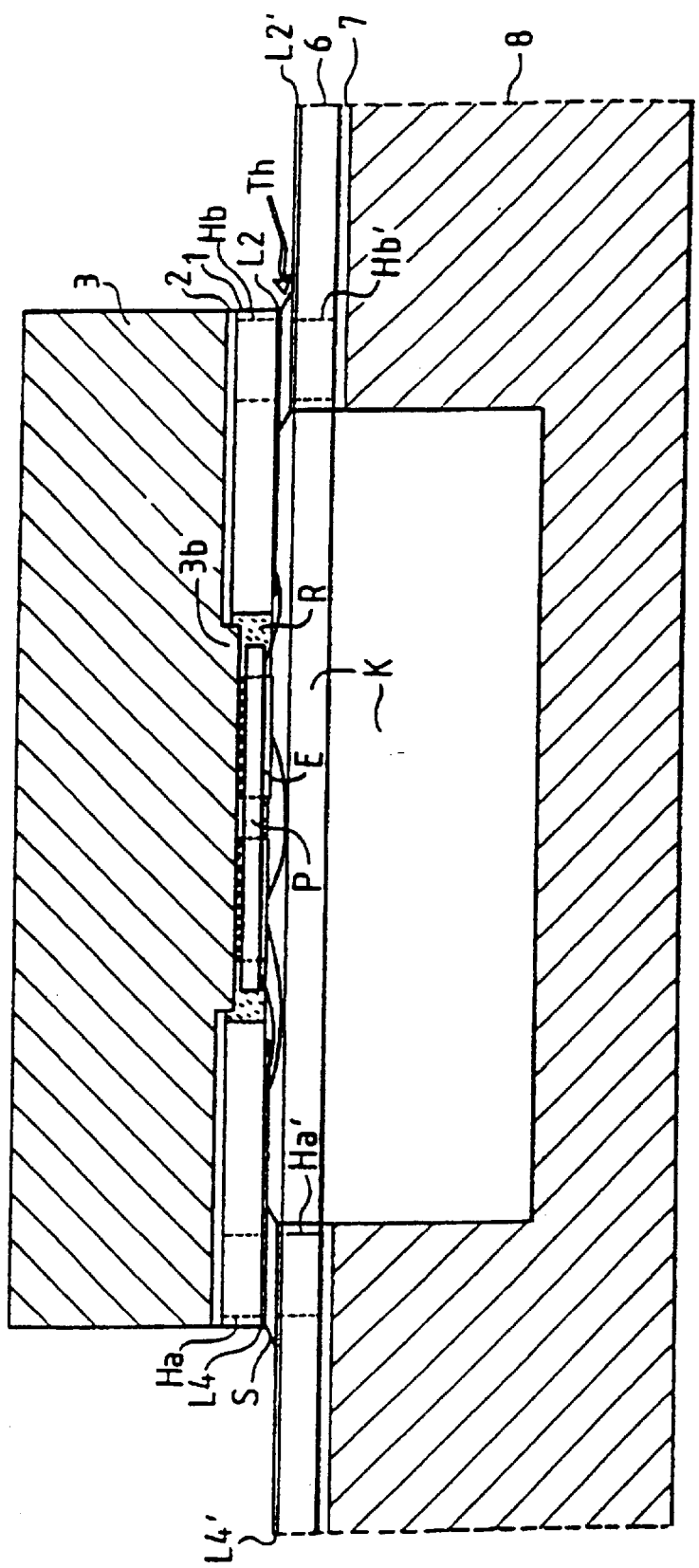
in FIG. 3, a sectional view of the printed circuits of FIGS. 1 and 2, after they have been joined together by soldering.

The package is illustrated in section in a rectangle lying in the upper part of FIG. 3; the plane of section, along line XX, is perpendicular to the plane of FIG. 1 and is parallel to the tracks L2, L4, lying along the middle of them. FIG. 3 also includes, adjoining the rectangle of the package, a lower rectangle; this rectangle corresponds to a sectional view of a printed circuit on which the face ABCD of the package rests; the package is said to be surface-mounted on the printed circuit.

The miniature printed circuit of the package includes an insulating substrate 1 with, on one side, the face illustrated in FIG. 1 and, on the other side, an earth plane comprising three successive layers: a metal coating, a coating of solder 2 and a conductive mechanical support 3 made of brass; in order to make the drawing easier to understand, the metal coating on the substrate 1 and the solder, between this coating and the mechanical support 3, have been merged in the drawing in FIG. 3 so as to show only a conductive layer 2.

The package has the particular feature, compared with a conventional package in which the support 3 is a simple brass plate with parallel faces, of possessing a projection or tab 3b in its support, on the substrate side, level with a hole made in the substrate for soldering the chip P to the earth plane. Usually, that is to say without the tab 3b, the chip P is soldered to the earth plane, directly on the support 3; its face opposite the earth plane is at a given distance from that face of the miniature printed circuit which bears the tracks L1 to L4. When, in order to protect the chip, resin is deposited thereon, it proves impossible to have only the thin layer of resin strictly needed for the protection; the resin, which then greatly modifies the propagation medium on the side with the chip connections, disturbs the operation above frequencies greater than 10 GHz. The presence of the tab 3b greatly reduces the said given distance; that one of the faces of the miniature printed circuit which bears the tracks L1 to L4 is then used as a reference level for the amount of resin to be deposited, thereby making it possible to control the thickness of resin on the chip.

FIG. 3 shows, in dotted lines, the holes Ha, Hb referred to in the description of FIG. 1; these are, as in the case of the other twelve holes drilled in the earth planes M1 to M4, holes with metallized walls, or plated through-holes, which constitute parallel conducting columns between the earth plane 2, 3 and the earth planes M1 to M4.

Figure 2:
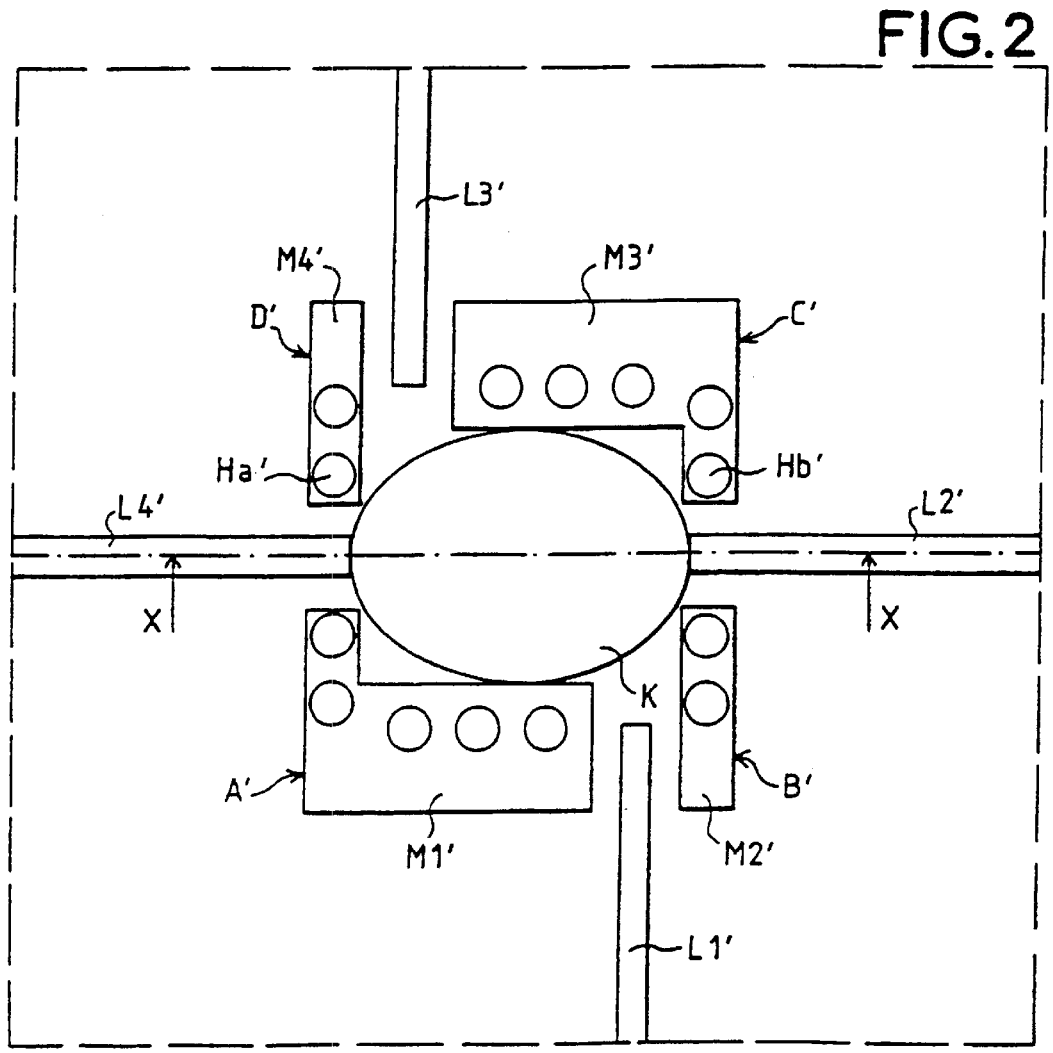

FIG. 2 is a partial view of a receiving printed circuit, in its part dedicated to the package that has just been described above with the aid of FIG. 1, and of the rectangle in the upper part of FIG. 3. The rectangle in the lower part of FIG. 3 corresponds to a sectional view of the printed circuit of FIG. 1, in a plane of section along line XX; the plane of section is perpendicular to the plane of FIG. 2. It should be noted that it is intentional that the lines of section bear the same reference symbols in FIGS. 1 and 2; this is so as to indicate the fact that, when the package is mounted in the predetermined position that it has to occupy on the printed circuit, the two planes of section are coincident.

The printed circuit in FIG. 2 and in the lower part of FIG. 3 includes an insulating substrate 6 with, on one side, conducting tracks L1' to L4' and earth planes M1' to M4', illustrated in FIG. 2, and, on the other side, an earth plane comprising three successive layers: a metal coating, a solder coating 7 and a mechanical brass support 8; here again, for the ease of understanding the drawing, the metal coating on the substrate 6 and the solder between this coating and the mechanical support 8 have been merged in the drawing in FIG. 3.

The tracks L2', L4' are microwave tracks through which the plane of section passes longitudinally through their middle and the tracks L1', L3' are tracks intended for supplying bias voltages.

Each of the earth planes M1' to M4' is drilled with holes such as Ha', Hb'. These holes, the wall of which is metallized, provide a conducting connection between the earth planes M1' to M4' lying on one side of the printed circuit and the earth plane 7, 8 lying on the other side of the printed circuit.

In FIG. 2, four points A', B', C', D' forming the apexes of a square have been indicated by arrows; they correspond to the exact positions that the apexes ABCD of the face of the miniature printed circuit illustrated in FIG. 1 must occupy, respectively, when the package is being mounted on the receiving printed circuit; it is in this position of the package with respect to its receiving printed circuit that the section in FIG. 3 is made. It should be pointed out, by comparing FIGS. 1 and 2, that the earth planes and the orifices of the plated through-holes lying in the square A'B'C'D' correspond, point for point, in a symmetry with respect to a plane, to the earth planes and to the orifices of the plated through-holes lying in the square ABCD; in the case of the conducting tracks, this symmetry also exists, but only with respect to part of the tracks of the square ABCD, since the tracks extend less inside the square A'B'C'D' than inside the square ABCD. Thus, when the apexes ABCD of the miniature printed circuit are above the points A'B'C'D' respectively, the conducting tracks L1' to L4' and the earth planes M1' to M4' are entirely opposite the tracks and the corresponding earth planes of the package; in addition, the fourteen plated through-holes in the package lie along the extension of the fourteen plated through-holes in the receiving printed circuit.

Connecting the package to its receiving circuit consists, in the example described, in firstly applying a thin layer of solder to the tracks and to the earth planes which lie opposite when the square ABCD is above the square A'B'C'D'; the package is then positioned on the receiving circuit in such a way that the square ABCD is exactly above the square A'B'C'D' and that the facing tracks and the facing earth planes can be soldered together by thermal bonding. In FIG. 3, the heat influx providing the thermal bonding has been shown symbolically by an arrow Th; as regards the solder layer which connects the tracks L4 and L4' after thermal bonding, this has been denoted by S in FIG. 3.

The package, thus mounted on the receiving printed circuit, has its chip, which is contained in a kind of cage forming a screen, bounded upwardly by the earth plane 2, 3, downwardly by the earth plane 7, 8 and laterally by the fourteen pairs of plated through-holes in the package (the term "pair of plated through-holes" should be understood to mean the holes, such as Ha and Ha', which lie along the extension of each other when the package is being mounted on its receiving printed circuit), as well as the thickness of solder between the holes, such as Ha and Ha'.

FIGS. 2 and 3 show that recessed into the receiving printed circuit is a cavity K, of oval cross section, which opens below the chip P when the package is mounted on the receiving printed circuit. The dimensions of this cavity are such that the distance from the chip P to the closest walls of the earth plane 7, 8 is about five times greater than in the same mounting but without the cavity; the function of this cavity is to prevent perturbations in the operation of the chip which are due to the radiation being much too close to a metal plane, in this case the earth plane 7, 8.

As a variant of the example described above, the chip P may be mounted in a conventional manner, that is to say on an earth plane such as 2, 3 without the tab such as 3b; the chip may also not be protected by a resin coating, given that, after the package has been mounted on its receiving printed circuit, the chip lies in a virtually closed space, the impermeability of which may moreover be improved by a seal made of an insulating material, for example a cement, placed all around the package at the junction between the package and the receiving printed circuit; taking into account the expected performance, it is even possible, in some cases, not to provide a cavity, vertically in line with the chip, in the receiving printed circuit.

In addition, the package may be produced with the chip placed on the miniature printed circuit in a mounting called a bumped-chip or flip-chip mounting; however, this mounting, in which the bumps on the chip are in direct contact with the miniature printed circuit, does not allow good heat dissipation since the chip is no longer pressed against an earth plane which serves as a heat sink for it.

Another variant of the examples described above consists, in order to enclose in a kind of Faraday cage, in replacing, in the miniature circuit, the plated through-holes with metallizations produced on the edge of the miniature printed circuit, between the outer edges of the earth planes such as M1 to M4 and the earth plane such as 2, 3.

An advantageous variant of the embodiment of the microwave package and the receiving printed circuit according to FIGS. 1 to 3 is described below with the aid of FIGS. 4 to 7.

The tab 3b on the brass mechanical support 3 was, in the embodiment in FIGS. 1 and 3, obtained by machining, an operation which is relatively expensive in the case of mass production. In order to reduce the cost, the idea has been to substitute the technique of drawing for that of machining in the case of mass production of the support 3. Since the support 3 is small in size, 5×5 mm in the example described in the case of the square ABCD in FIG. 1, the cost of the material used is negligible compared with the manufacturing cost; the saving made by drawing allows the manufacturing cost of this support to be reduced by a factor of ten.

Added to this idea of producing the tab 3b by drawing is the idea of modifying the microwave package in such a way that the four earth planes M1 to M4 of the miniature printed circuit, as they appear in FIG. 1, are replaced with earth planes formed by the upper face of suitably placed tabs on the support; this idea of earth planes obtained by tabs was therefore extended to the idea of producing these tabs during the same drawing operation as that for the tab 3b. Unfortunately, it turned out that, in the case of the package to be produced, the size of the tabs was too great not to result, during the drawing operation, in undesirable distortions of the brass block. In order to avoid this drawback, it was decided to produce only part of the planes M1 to M4 using tabs. This has led to obtaining only about one third of the earth planes M1, M3 using tabs and in choosing, for this third, tabs which are perpendicular to the tracks L2, L4 of the microwave contacts; this choice was guided by two observations, namely that the screens produced by tabs between earth planes prove to be more effective than those produced by plated through-holes between earth planes, and that the screens perpendicular to the tracks are of greater importance than those parallel to these tracks.

Figure 4:
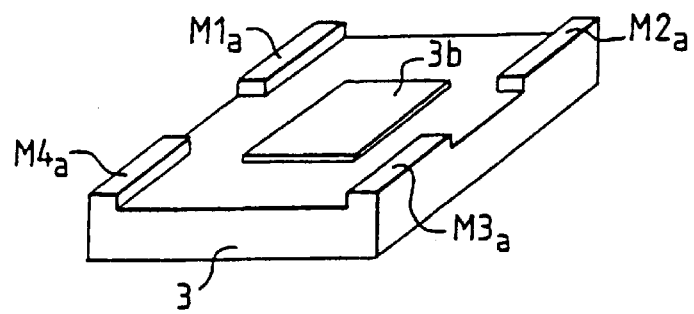
in FIG. 4, a perspective view of one embodiment of one of the elements described using FIG. 3; and in FIGS. 5 to 7, views corresponding to the views in FIGS. 1 to 3, respectively, but in an embodiment which includes the element in FIG. 4.

FIG. 4 is a perspective view of a support 3 obtained by drawing, as indicated above. In this view, five tabs may be seen, namely the tab 3b and four tabs $M1_a$ to $M4_a$.

Figure 5:
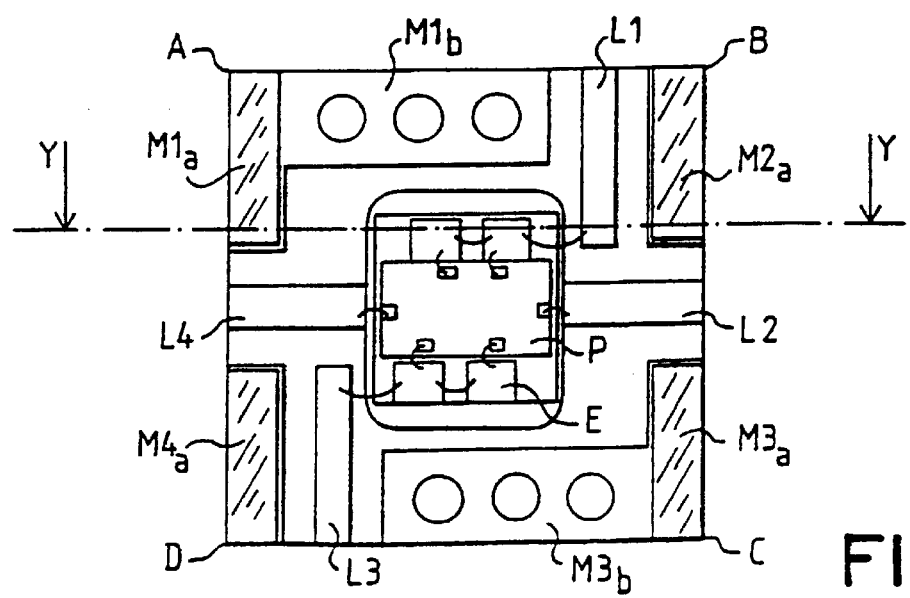

FIG. 5 is a view which corresponds to the view in FIG. 1, but in an embodiment using the support 3 in FIG. 4. This view is distinguished from that in FIG. 1 by the fact that the earth planes M1 to M4 consist partly of the upper faces of the tabs $M1_a$ to $M4_a$, which upper faces are left uncovered by the substrate of the miniature printed circuit and are flush with the front face of the miniature printed circuit. In order to distinguish the upper faces of the tabs from the miniature printed circuit, they have been shaded in FIG. 5.

It should be noted that, everywhere the miniature printed circuit is close to the tabs $M1_a$ to $M4_a$, it bears, on its edge and on its front face, copper coatings; this makes it possible, when mounting the miniature printed circuit on its brass mechanical support 3, for there to be good wicking of the solder between the tabs and the miniature printed circuit.

It should also be noted that their position around the miniature printed circuit facilitates "support/miniature printed circuit" mounting; this is because the tabs serve as guiding elements for positioning the miniature printed circuit on its support.

The earth planes M1 to M4 in FIG. 1 are replaced in FIG. 5 with the earth planes $M1_a+M1_b$, $M2_a$, $M3_a+M3_b$, $M4_a$, respectively. In these new earth planes, the parts $M1_b$, $M3_b$ are copper coatings borne by the front face of the miniature printed circuit and are connected, via plated through-holes, to the earth plane of the rear face of the miniature printed circuit.

The receiving printed circuit in FIGS. 2 and 3 may be used as the receiving circuit dedicated to the microwave package described with the aid of FIGS. 4 and 5. As a variant, a receiving printed circuit is proposed whose front face is illustrated, in a partial view, in FIG. 6. This is a receiving circuit which is distinguished from that in FIGS. 2 and 3 only by the way in which its earth planes of the front face are formed.

Figure 6:
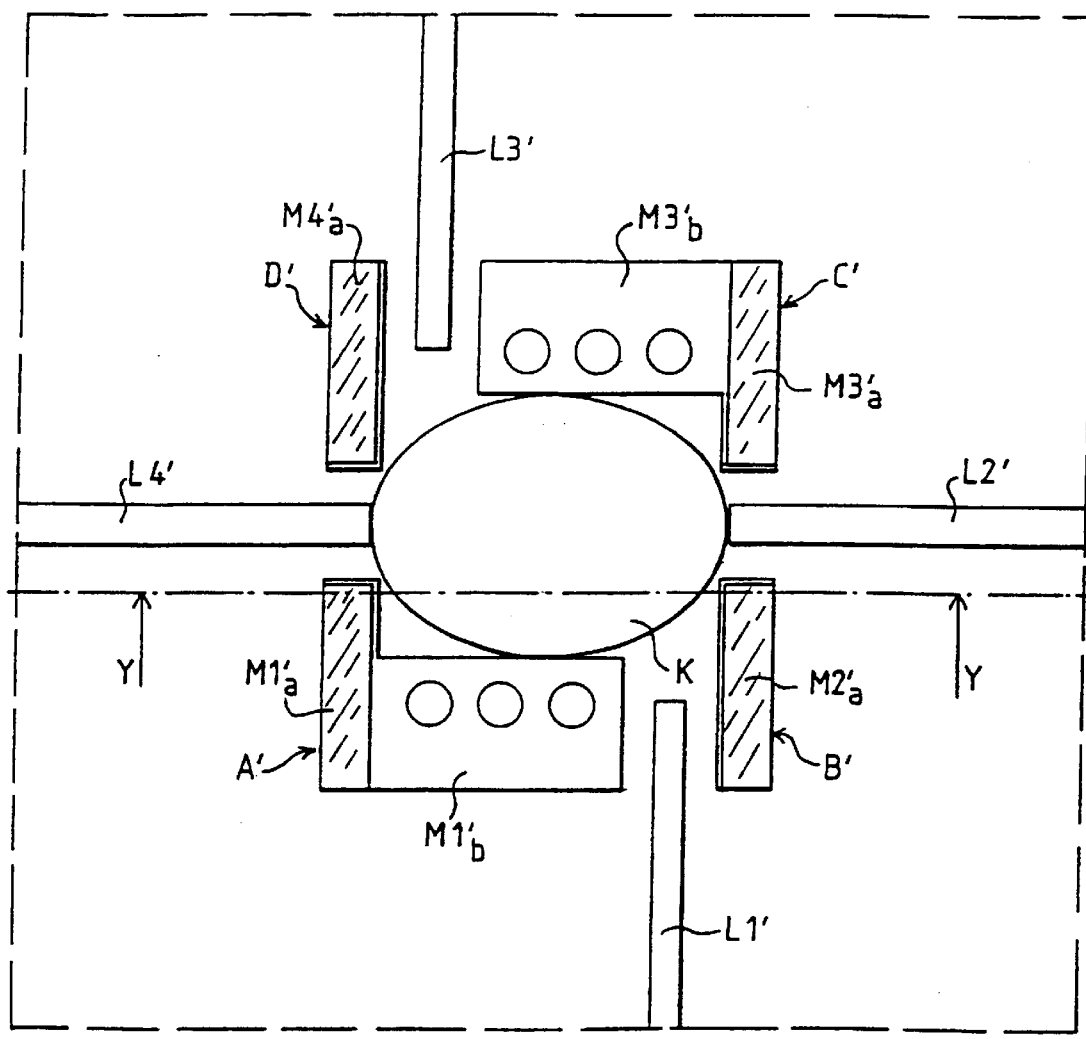

Whereas the earth planes M1' to M4' were all obtained by metal coatings, in the variant in FIG. 6 they consist partly of the upper faces of tabs; these tabs are obtained by drawing a brass plate and the mechanical support thus produced fulfils the same function as the mechanical support 8 in FIG. 3. These tabs, referenced $M1'_a$ to $M4'_a$, are placed so as to correspond to the tabs $M1_a$ to $M4_a$; they thus give, with copper coatings $M1'_b$ to $M3'_b$ borne by the front face of the receiving circuit, earth planes $M1'_a+M1'_b$, $M2'_a$, $M3'_a+M3'_b$, $M4'_a$ which are equivalent to the earth planes M1 to M4 in FIG. 2, respectively.

Figure 7:
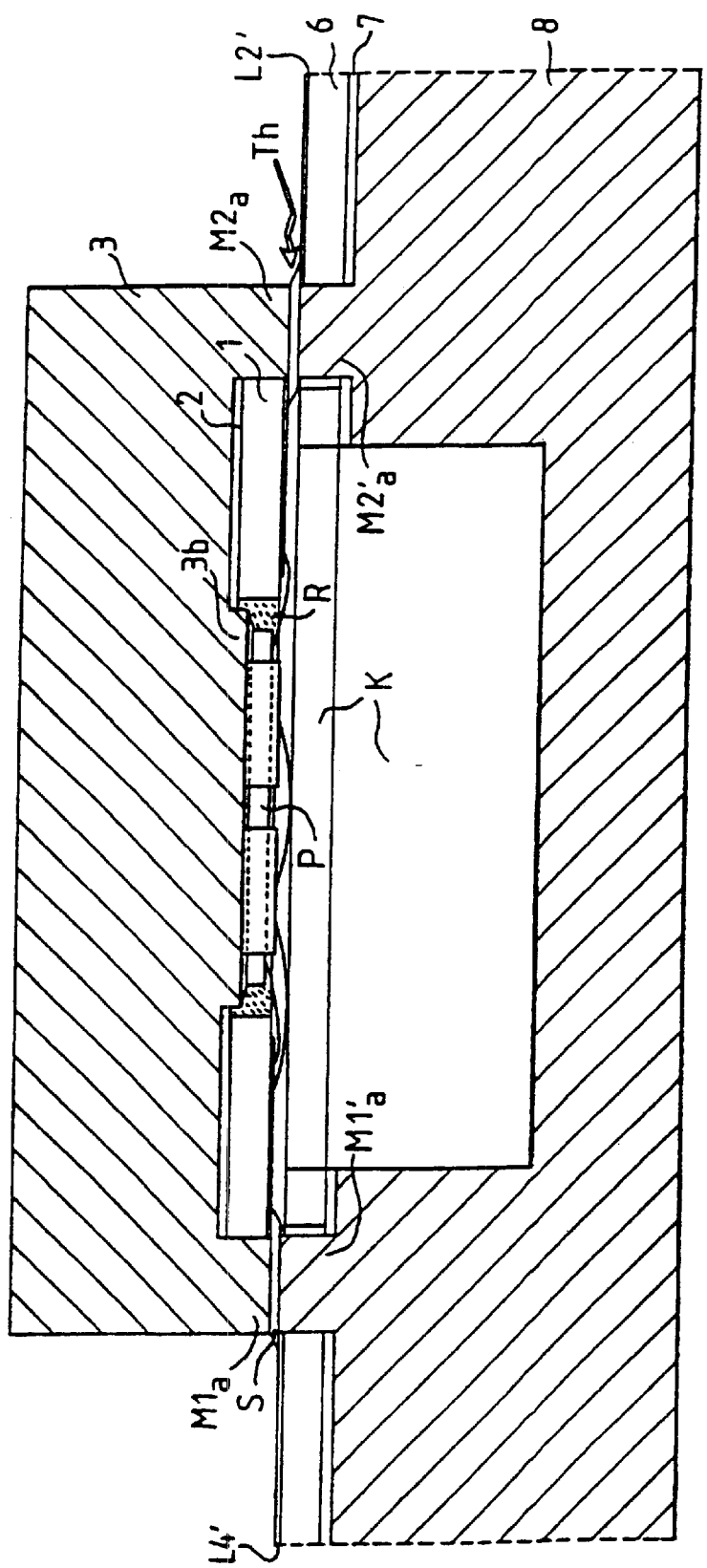

The package in FIGS. 4 and 5 is connected to its receiving circuit in FIG. 6 as in the embodiment described with the aid of FIGS. 1 to 3. FIG. 7 is a sectional view of the assembly thus produced. The line of the plane of section is denoted YY in FIGS. 5 and 6; compared with the section in FIG. 3, the plane of section has been shifted so as to pass through the tabs $M1_a$, $M2_a$, $M1'_a$, $M2'_a$.

In the sectional view in FIG. 7, the supports have been denoted by 3 and 8 in order to indicate that, despite their tabs such as $M1_a$ and $M2_a$ and $M1'_a$ and $M2'_a$, they were equivalent to the supports 3 and 8 illustrated in FIG. 3.

It should be noted that, in the embodiment in FIGS. 4 to 7, the tabs $M1_a$–$M4_a$, $M1'_a$–$M4'_a$ fulfil two functions: (1) an earth plane by their upper faces and (2) a connection between, on the one hand, the two faces of the miniature printed circuit and, on the other hand, the two faces of the receiving printed circuit.

In all or some of FIGS. 5 to 7, elements appear which bear the same reference symbols 1, 2, 6, 7, K, P, etc. as elements already described with the aid of FIGS. 1 to 3. These are elements equivalent to those in FIGS. 1 to 3, so that the comments made with regard to the description of FIGS. 1 to 3, for example relating to the cavity K, remain valid within the context of FIGS. 5 to 7.

What is claimed is:

1. A microwave package for mounting on a printed circuit, comprising:

a printed circuit;

a first face of the printed circuit that includes an electronic chip and at least one conductor connected to the chip; and a second face of the printed circuit that includes an earth plane; and a conductive mechanical support that includes at least one tab of a thickened portion of said conductive mechanical support positioned to face the electronic chip of the first face of the printed circuit, wherein the first face of the printed circuit includes at least one earth plane, and at least one conductor, and the printed circuit includes connections between the at least one earth plane of the first face of the printed circuit and the earth plane of the second face of the printed circuit.

2. A microwave package according to claim 1, wherein the connections are made by plated through-holes.

3. A microwave package according to claim 1, wherein the printed circuit includes the conductive mechanical support with first and second sides substantially parallel to each other, and further comprising:

an insulating substrate with first and second sides substantially parallel to each other and parallel to the first and second sides of the conductive mechanical support, wherein the second side of the insulating substrate is fastened by a conductive layer to the first side of the conductive mechanical support, and wherein a shape of the insulating substrate and a position of the insulating substrate with respect to the conductive mechanical support leaves the at least one tab uncovered by the insulating substrate.

4. A microwave package according to claim 3, wherein the at least one tab is soldered to the electronic chip.

5. A microwave package according to claim 3, wherein the at least one tab is located against a periphery of the insulating substrate with each at least one tab having an upper part, respectively, substantially level with a first side of the insulating substrate and each upper part connects to the at least one earth plane of the first face of the printed circuit.

6. A microwave package according to claim 3, wherein the at least one tab of the conductive mechanical support is formed by drawing.

7. A printed circuit for mounting a microwave package comprising:

a first face of the printed circuit that includes conductors in a dedicated receiving area for the microwave package;

a second face of the printed circuit that includes an earth plane;

a conductive mechanical support for the second face of the printed circuit; and a cavity that runs into the dedicated receiving area and is surrounded by the at least one conductor and the at least one earth plane of the first face, wherein the first face includes at least one earth plane in the dedicated receiving area, the at least one earth plane of the first face is inserted between the conductors of the first face, the printed circuit includes connections between the at least one earth plane of the first face and the earth plane of the second face, and the microwave package is mounted such that it is separated from the cavity.

8. A printed circuit according to claim 7, wherein the connections are made by plated through-holes.

* * * * *